US006794918B1

United States Patent
Lu et al.

(12)

(10) Patent No.: US 6,794,918 B1
(45) Date of Patent: Sep. 21, 2004

(54) LOOP-BACK CLOCK PHASE GENERATOR

(75) Inventors: Hongwen Lu, San Diego, CA (US);
Thomas Clark Bryan, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/402,022

(22) Filed: Mar. 27, 2003

(51) Int. Cl.[7] .............................................. H03H 11/26
(52) U.S. Cl. ..................................... 327/269; 327/270
(58) Field of Search ................................ 327/269, 270, 327/271, 266, 291, 274, 287, 153, 158; 375/376

(56) References Cited

U.S. PATENT DOCUMENTS

| | | | | |
|---|---|---|---|---|
| 5,436,939 A | * | 7/1995 | Co et al. ..................... | 375/376 |
| 5,872,446 A | * | 2/1999 | Cranford et al. ............ | 323/315 |
| 6,218,892 B1 | * | 4/2001 | Soumyanath et al. ........ | 327/537 |
| 6,535,070 B2 | * | 3/2003 | Hwang et al. ................ | 331/57 |
| 2003/0179028 A1 | * | 9/2003 | Kizer et al. .................. | 327/158 |

* cited by examiner

Primary Examiner—Linh My Nguyen
(74) Attorney, Agent, or Firm—INCAPLAW; Terrance A. Meador

(57) ABSTRACT

A clock generator circuit includes a plurality of phase delay elements connected in series. The phase delay elements provide delayed output clock signals relative to an input clock signal. The circuit employs a loop-back path that connects the output of the final phase delay element to the input of the first phase delay element. The loop-back path enables the circuit to maintain an accurate overall phase delay between the input clock signal and the output clock signal generated by the final phase delay element. When implemented to support differential clock signals, the inverted outputs of the phase delay elements also serve as delayed clock signals. In accordance with one practical embodiment, the clock phase generator circuit provides evenly distributed clock phases over one clock period.

21 Claims, 2 Drawing Sheets

LOOP-BACK CLOCK PHASE GENERATOR

FIELD OF THE INVENTION

The present invention relates generally to digital clock circuits. More particularly, the present invention relates to a clock phase generator circuit that provides a number of phase-delayed clock signals generated in response to an input clock signal.

BACKGROUND OF THE INVENTION

Clock phase generator circuits provide different clock phases based upon an input clock signal. For example, certain applications require a set of clock phases that are evenly distributed across one clock period. One conventional design for a clock phase generator employs a number of voltage-controlled phase delay elements connected in series such that the input clock signal is increasingly delayed as it propagates through the delay elements. Ideally, the series of phase delay elements is designed to provide an overall phase delay equal to 180 degrees, and inverted versions of the delayed clock signals provide delay values between 180 and 360 degrees. However, in practical implementations, a precise 180 degree delay cannot be guaranteed due to the imprecise nature of the control voltage applied to the delay elements. Furthermore, the load experienced by each phase delay element may not be identical. These effects can result in a set of unevenly distributed phase delayed signals with varied amplitude characteristics. Furthermore, for differential clock phase signals, a long string of delay elements without feedback may result in an accumulation of common-mode voltage offset between the positive and negative differential signal components. Such an accumulation of offset voltage can distort or corrupt the clock phase signals. Consequently, this prior art configuration may not be suitable in applications that require precise phase delay spacing throughout a clock period.

BRIEF SUMMARY OF THE INVENTION

A clock phase generator circuit according to the invention utilizes a loop-back path from the output of the last phase delay element to the input of the first phase delay element. The circuit is configured such that each of the phase delay elements are equally loaded, which equalizes the phase intervals and the amplitude of the generated clock signals. The circuit configuration, along with the loop-back path, enables the circuit to accurately provide a number of clock signals that have evenly distributed phase delays relative to the input clock signal.

The above and other aspects of the present invention may be carried out in one form by a clock phase generator circuit comprising a first node for receiving an input clock signal, a second node for receiving a control signal, a plurality of phase delay elements coupled in series, where at least one of the phase delay elements is coupled to the input node, and where each phase delay element provides a respective phase delay that is determined by the control signal, and a loop-back path between an output of one of the phase delay elements and the first node. The phase delay elements provide a number of output clock signals having different phase delays, relative to the input clock signal.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. In addition, those skilled in the art will appreciate that the present invention may be practiced in conjunction with any number of data transmission protocols and that the system described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional techniques for clock signal generation, control voltage regulation, generation of phase delay by a delay element, and other functional aspects of the circuit (and the individual operating components of the circuit) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits are not adversely affected).

As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node). As used herein, a "port" means a node that is externally accessible via, for example, a physical connector, an input/output pin, a test probe, or the like.

Figure 1:
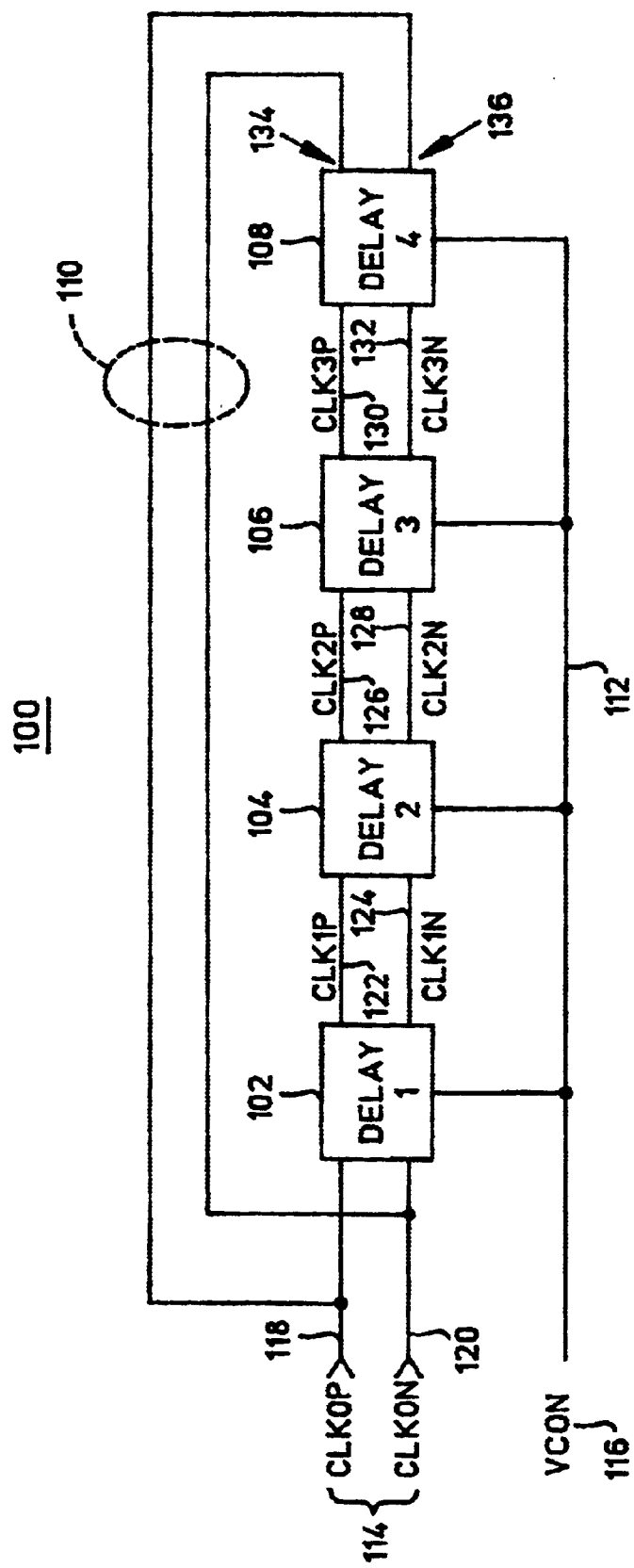
FIG. 1 is a schematic representation of a clock phase generator circuit.

FIG. 1 is a schematic representation of a clock phase generator circuit 100 configured in accordance with one practical embodiment of the invention. Circuit 100 generally includes four phase delay elements 102/104/106/108 connected in series, a loop-back path 110, and at least one node 112 for providing a control signal (e.g., a control voltage or a control current) to the phase delay elements. In the illustrated embodiment, circuit 100 receives an input clock signal 114 and a control voltage 116, and generates a number of output clock signals having different amounts of phase delay relative to input clock signal 114. In accordance with one practical embodiment, input clock signal 114 (and the various delayed clock signals generated by circuit 100) may have a frequency of up to approximately 3 GHz. In other practical embodiments, the frequency may be higher or lower, depending upon the specific application. Practical device and process limitations may place a minimum on the amount of delay introduced by any single phase delay element. Consequently, at very high frequencies (e.g., frequencies exceeding 5 GHz), the very short clock period may place limitations or restrictions on a practical implementation of circuit 100.

In this example embodiment, each phase delay element is a differential phase delay element that receives a differential input clock signal and generates, from the differential input clock signal, a differential output clock signal. In this regard, the differential output clock signal represents the differential input clock signal delayed by a particular phase delay. The amount of phase delay introduced by a phase delay element is determined by its respective control signal. In practice, control voltage 116 is a differential voltage; FIG. 1 depicts control voltage 116 as a single-ended signal for the sake of clarity and to simplify the schematic. Control voltage 116 may be obtained from a delay locked loop or other suitable circuit, and, due to the loop-back configuration of circuit 100, its value need not be precisely controlled.

Input clock signal 114 is depicted as a differential signal having a positive component (CLK0P) and a negative component (CLK0N). Input clock signal 114 represents a clock signal having an ideal phase delay of zero degrees. One input node 118 receives the CLK0P component and another input node 120 receives the CLK0N component. Input node 118 corresponds to a positive input of first phase delay element 102, input node 120 corresponds to a negative input of first phase delay element 102, and node 112 corresponds to a control signal input of first phase delay element 102. First phase delay element 102 is configured to delay input clock signal 114 by a first phase delay determined by control voltage 116 and to generate a first differential output clock signal that represents a delayed version of input clock signal 114. This differential output clock signal has a positive component (CLK1P) and a negative component (CLK1N).

As shown in FIG. 1, first phase delay element 102 generates the CLK1P component onto a node 122, and generates the CLK1N component onto a node 124. In the example embodiment, node 122 corresponds to both a positive output of first phase delay element 102 and a positive input of second phase delay element 104. Similarly, node 124 corresponds to both a negative output of first phase delay element 102 and a negative input of second phase delay element 104. In other words, in this embodiment the output of phase delay element 102 is directly connected to the input of phase delay element 104. Second phase delay element 104 also receives control voltage 116 via node 112. Second phase delay element 104 is suitably configured to delay the first differential output clock signal by a second phase delay determined by control voltage 116, and to generate a second differential output clock signal that represents a delayed version of the first differential output clock signal. The second differential output clock signal has a positive component (CLK2P) and a negative component (CLK2N).

Second phase delay element 104 generates the CLK2P component onto a node 126, and generates the CLK2N component onto a node 128. Node 126 corresponds to both a positive output of second phase delay element 104 and a positive input of third phase delay element 106. Node 128 corresponds to both a negative output of second phase delay element 104 and a negative input of third phase delay element 106. Third phase delay element 106 also receives control voltage 116 via node 112. Third phase delay element 106 is suitably configured to delay the second differential output clock signal by a third phase delay determined by control voltage 116, and to generate a third differential output clock signal that represents a delayed version of the second differential output clock signal. The third differential output clock signal has a positive component (CLK3P) and a negative component (CLK3N).

Third phase delay element 106 generates the CLK3P component onto a node 130, and generates the CLK3N component onto a node 132. Node 130 corresponds to both a positive output of third phase delay element 106 and a positive input of fourth phase delay element 108. Node 132 corresponds to both a negative output of third phase delay element 106 and a negative input of fourth phase delay element 108. Fourth phase delay element 108 also receives control voltage 116 via node 112. Fourth phase delay element 108 is suitably configured to delay the third differential output clock signal by a fourth phase delay determined by control voltage 116, and to generate a fourth differential output clock signal that represents a delayed version of the third differential output clock signal. The fourth differential output clock signal has a positive component and a negative component. Fourth phase delay element 108 functions as the final phase delay element in clock phase generator circuit 100.

In the example embodiment, loop-back path 110 connects a positive output 134 of fourth phase delay element 108 to input node 120, which corresponds to the negative input of first phase delay element 102. Loop-back path 110 also connects a negative output 136 of fourth phase delay element 108 to input node 118, which corresponds to the positive input of first phase delay element 102. Thus, loop-back path 110 inverts the fourth differential output clock signal and provides the inverted clock signal as an input to first phase delay element 102.

In accordance with one practical embodiment, each of the phase delay elements in clock phase generator circuit 100 is a Gilbert cell. In this context, a Gilbert cell has two differential transistor pairs, where one pair receives a differential input signal and the other pair receives a delayed differential input signal. The output of the Gilbert cell is a summation of the output signals taken from the two differential pairs. The delay of the Gilbert cell can be changed with control voltage to adjust the respective contributions of the input signal and the delayed input signal. The specific layout and operation of a Gilbert cell is well known and, therefore, will not be described in detail herein. A Gilbert cell is merely one practical implementation of a phase delay element suitable for use in circuit 100.

In the preferred embodiment, each of the phase delay elements in circuit 100 is "identical" such that, theoretically, each of the phase delay elements adds the same amount of phase delay in response to the common control voltage 116. Circuit 100 can generate a plurality of clock phases that are evenly distributed over one clock period or 360 degrees. For example, if the control voltage adjusts the delay of each delay element to be approximately one-eighth of a clock period, then each of the phase delay elements in circuit 100 may be configured to provide 45 degrees of phase delay. Depending upon the specific application, to compensate for process, temperature, and voltage variation, the differential control voltage can vary up to approximately the supply voltage of circuit 100 to obtain 45 degrees of phase delay from the delay elements. Thus, the first differential output clock signal represents the differential input clock signal delayed by 45 degrees, the second differential output clock signal represents the differential input clock signal delayed by 90 degrees, the third differential output clock signal represents the differential input clock signal delayed by 135 degrees, and the fourth differential output clock signal represents the differential input clock signal delayed by 180 degrees. The four different delayed clock signals can be individually accessed at the respective outputs of the delay elements.

Due to the differential nature of the various clock signals generated by circuit 100, the inverted versions of the differential output clock signals may also be used as additional delayed clock signals. For the example embodiment, the inverse of the first differential output clock signal represents the differential input clock signal delayed by 225 degrees, the inverse of the second differential output clock signal represents the differential input clock signal delayed by 270 degrees, the inverse of the third differential output clock signal represents the differential input clock signal delayed by 315 degrees, and the inverse of the fourth differential output clock signal represents the differential input clock signal delayed by 360 degrees. The different clock phases generated by circuit 100 are summarized in Table 1 below.

TABLE 1

Example Clock Phase Signals

| Phase | Clock Signals | Phase Delay |
|---|---|---|
| 0 | CLK0P - CLK0N | 0/360 |
| 1 | CLK1P - CLK1N | 45 |
| 2 | CLK2P - CLK2N | 90 |
| 3 | CLK3P - CLK3N | 135 |
| 4 | CLK0N - CLK0P | 180 |
| 5 | CLK1N - CLK1P | 225 |
| 6 | CLK2N - CLK2P | 270 |
| 7 | CLK3N - CLK3P | 315 |

Loop-back path 110 functions to provide a consistent 180 degree phase delay between input clock signal 114 and the fourth differential output clock signal generated by fourth phase delay element 108. Consequently, although the delay contributed by the individual phase delay elements may vary slightly below or above the nominal 45 degree delay, circuit 100 accurately maintains the overall delay at (or very close to) the nominal 180 degree phase delay. The amount of tolerable phase variation will depend upon the application. For example, if only eight phases are generated, then a tolerance of plus/minus five degrees may be acceptable. If, however, 32 phases are generated, then a tolerance of only one degree may be more reasonable. Loop-back path 110 enables circuit 100 to generate the inverted clock phase signals such that the nominal 360 degree phase delay is accurately maintained.

Figure 2:
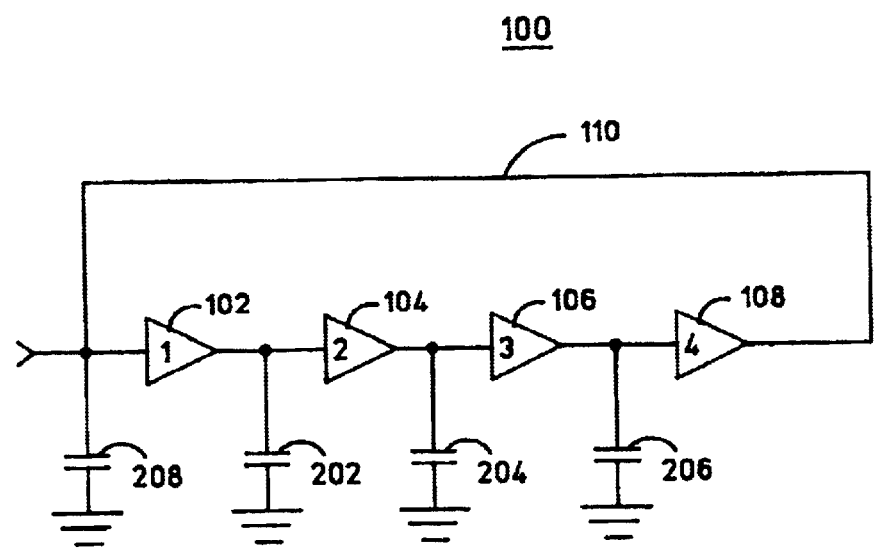
FIG. 2 is an alternate schematic representation of the clock phase generator circuit of FIG. 1.

FIG. 2 is an alternate schematic representation of clock phase generator circuit 100. For the sake of clarity, the differential clock signals are depicted as signals-ended signals, and the control signals are not shown. FIG. 2 illustrates that each of the phase delay elements experience the same output load. In the regard, the output loads are represented at least in part by parasitic capacitances between each output node and ground. For example, phase delay element 102 experiences a load associated with second phase delay element 104 and loading capacitance 202. Phase delay element 104 experiences a load associated with third phase delay element 106 and loading capacitance 204. Likewise, phase delay element 106 experiences a load associated with fourth phase delay element 108 and loading capacitance 206. In addition, loop-back path 110 causes phase delay element 108 to experience a load associated with first phase delay element 102 and loading capacitance 208. The loading capacitances and the input impedances of each phase delay element can be specified and designed into the practical circuit configuration, thus ensuring that each phase delay element is equally loaded. Equal loading promotes evenly distributed clock phases and consistent amplitude among the various delayed clock signals. For a differential implementation, since the positive and negative outputs of the last delay element are respectively connected to the negative and positive inputs of the first delay element, any common-mode offset voltage along the delay element chain will be corrected by the feedback loop. In other words, the negative feedback nature of the circuit accomplishes common-mode offset correction, regardless of the number of delay cells in the circuit.

Figure 3:
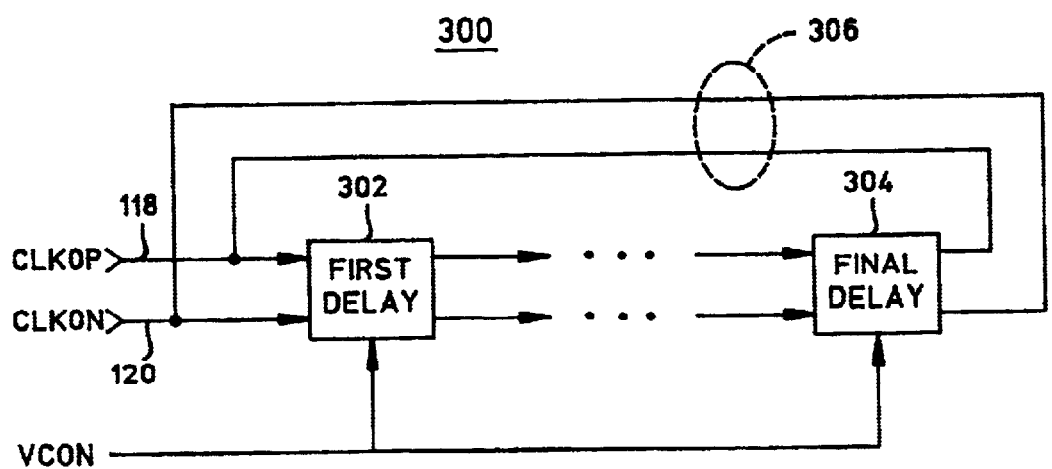
FIG. 3 is a schematic representation of a generalized clock phase generator circuit.

FIG. 3 is a schematic representation of a generalized clock phase generator circuit 300 according to the invention. Although not a requirement of the invention, circuit 300 utilizes differential phase delay elements, including at least a first phase delay element 302 and a final phase delay element 304. As described above in connection with circuit 100, clock phase generator circuit 300 includes a loop-back path 306 established between the output of final phase delay element 304 and the input of first phase delay element 302.

In one possible embodiment, the output of first phase delay element 302 is directly connected to the input of final phase delay element 304. FIG. 3, however, includes ellipses between first phase delay element 302 and final phase delay element 304; the ellipses indicate that a practical embodiment may include any number of intervening phase delay elements connected in series between first phase delay element 302 and final phase delay element 304. For example, clock phase generator circuit 100 represents one version of circuit 300 having two additional phase delay elements connected in series.

As mentioned previously, an equivalent clock phase generator circuit can be realized with single-ended (i.e., not differential) phase delay elements that receive and generate respective single-ended clock signals. For example, eight 45-degree phase delay elements may be connected in series, with a loop-back path between the output of the final phase delay element and the input of the first phase delay element, such that clock phases between zero degrees and 360 degrees can be generated. Although possible, such a configuration may not be as practical or desirable relative to a differential embodiment.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A clock phase generator circuit comprising:
   a first phase delay element, said first phase delay element having positive and negative inputs for receiving a first differential input clock signal and a final differential output clock signal and positive and negative outputs for providing a first differential output clock signal that represents said first differential input clock signal delayed by a first phase delay determined by a control signal;

a final phase delay element, said final phase delay element having positive and negative inputs for receiving a final differential input clock signal and positive and negative outputs for providing said a final differential output clock signal, said final differential output clock signal representing said final differential input clock signal delayed by a final phase delay determined by said control signal; and a loop-back path connecting said positive output of said final phase delay element to said negative input of said first phase delay element, and connecting said negative output of said final phase delay element to said positive input of said first phase delay element.

2. A circuit according to claim 1, wherein said positive and negative outputs of said first phase delay element are respectively coupled to said positive and negative inputs of said final phase delay element.

3. A circuit according to claim 1, wherein said final differential output clock signal represents said first differential input clock signal delayed by 180 degrees.

4. A circuit according to claim 1, further comprising:

a second phase delay element, said second phase delay element having positive and negative inputs, respectively coupled to said positive and negative outputs of said first phase delay element, and positive and negative outputs for a second differential output clock signal that represents said first differential output clock signal delayed by a second phase delay determined by said control signal; and a third phase delay element, said third phase delay element having positive and negative inputs, respectively coupled to said positive and negative outputs of said second phase delay element, and positive and negative outputs for a third differential output clock signal that represents said second differential output clock signal delayed by a third phase delay determined by said control signal.

5. A circuit according to claim 4, wherein:

said first differential output clock signal represents said first differential input clock signal delayed by 45 degrees;

said second differential output clock signal represents said first differential input clock signal delayed by 90 degrees;

said third differential output clock signal represents said first differential input clock signal delayed by 135 degrees; and said final differential output clock signal represents said first differential input clock signal delayed by 180 degrees.

6. A circuit according to claim 4, wherein:

the inverse of said first differential output clock signal represents said first differential input clock signal delayed by 225 degrees;

the inverse of said second differential output clock signal represents said first differential input clock signal delayed by 270 degrees;

the inverse of said third differential output clock signal represents said first differential input clock signal delayed by 315 degrees; and the inverse of said final differential output clock signal represents said first differential input clock signal delayed by 360 degrees.

7. A circuit according to claim 1, wherein each of said first phase delay element and said final phase delay element is a Gilbert cell.

8. A circuit according to claim 1, wherein said control signal comprises a control voltage.

9. A circuit according to claim 1, wherein said control signal comprises a control current.

10. A circuit according to claim 1, wherein each of said first phase delay element and said final phase delay element are equally loaded.

11. A clock phase generator circuit comprising:

a first node for receiving an input clock signal and a delayed version of said input clock signal;

a second node for receiving a control signal;

a plurality of phase delay elements coupled in series, at least one of said phase delay elements being coupled to said input node, each of said phase delay elements providing a respective phase delay that is determined by said control signal; and a loop-back path between an output of one of said phase delay elements and said first node for providing said delayed version of said input clock signal; wherein said phase delay elements provide a number of output clock signals having different phase delays, relative to said input dock signal.

12. A circuit according to claim 11, wherein:

said input clock signal is a differential input clock signal;

each of said phase delay elements is configured to receive a respective differential clock signal and to produce a respective differential delayed clock signal;

said loop-back path is a differential path; and said phase delay elements provide a number of differential output clock signals.

13. A circuit according to claim 11, wherein said number of output clock signals include at least:

a first output clock signal that represents said input clock signal delayed by 45 degrees;

a second output clock signal that represents said input clock signal delayed by 90 degrees;

a third output clock signal that represents said input clock signal delayed by 135 degrees; and a fourth output clock signal that represents said input clock signal delayed by 180 degrees.

14. A circuit according to claim 11, wherein each of said phase delay elements is a Gilbert cell.

15. A circuit according to claim 11, wherein said control signal comprises a control voltage.

16. A circuit according to claim 11, wherein said control signal comprises a control current.

17. A clock phase generator circuit comprising:

a first differential phase delay element configured to receive a first differential input clock signal and an inverted differential output clock signal that represents said first differential input clock signal delayed by a phase delay at a differential input, and to generate from said first differential input clock signal and said differential output clock signal a first differential output clock signal that represents said first differential input clock signal delayed by a first phase delay;

a second differential phase delay element configured to receive said first differential output clock signal, and to generate from said first differential output clock signal a second differential output clock signal that represents said first differential input clock signal delayed by a second phase delay;

a third differential phase delay element configured to receive said second differential output clock signal, and to generate from said second differential output clock signal a third differential output clock signal that represents said first differential Input clock signal delayed by a third phase delay;

a fourth differential phase delay element configured to receive said third differential output clock signal, and to generate from said third differential output clock signal a fourth differential output clock signal that represents said first differential input clock signal delayed by a fourth phase delay; and a loop-back path configured to invert said fourth differential output clock signal into said inverted differential clock signal and to provide said inverted differential clock signal at said differential input of said first differential phase delay element.

18. A circuit according to claim 17, wherein:

each of said first, second, third, and fourth differential phase delay elements receives a control signal; and said control signal determines a respective phase delay for each of said first, second, third, and fourth differential phase delay elements.

19. A circuit according to claim 18, wherein said control signal comprises a control voltage.

20. A circuit according to claim 17, wherein each of said first, second, third, and fourth differential phase delay elements is configured to provide a phase delay 45 degrees.

21. A circuit according to claim 17, wherein each of said first, second, third, and fourth differential phase delay elements is a Gilbert cell.

* * * * *